(12) United States Patent
Fuchikami et al.

(10) Patent No.: US 6,545,901 B2
(45) Date of Patent: Apr. 8, 2003

(54) SEMICONDUCTOR MEMORY DEVICE HAVING A SUPPLEMENTAL ELEMENT FOR READING DATA STORED IN A MEMORY ELEMENT

(75) Inventors: Takaaki Fuchikami, Kyoto (JP); Takanori Ozawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/953,091

(22) Filed: Sep. 13, 2001

(65) Prior Publication Data

US 2002/0044490 A1 Apr. 18, 2002

(30) Foreign Application Priority Data

Sep. 14, 2001 (JP) ..................................... 2000-280510

(51) Int. Cl.[7] .............................................. G11C 11/22
(52) U.S. Cl. ....................................... 365/145; 365/149
(58) Field of Search ................................. 365/145, 149

(56) References Cited

U.S. PATENT DOCUMENTS

| | | | | |
|---|---|---|---|---|
| 6,067,265 A | * | 5/2000 | Mukumoki et al. | 365/210 |
| 6,094,369 A | * | 7/2000 | Ozawa et al. | 365/145 |
| 6,363,002 B1 | * | 3/2002 | Nishimura et al. | 365/145 |

* cited by examiner

Primary Examiner—M. Tran
(74) Attorney, Agent, or Firm—Hogan & Hartson, LLP

(57) ABSTRACT

A semiconductor memory device including a memory element for storing data, and a supplemental element substantially electrically associated with the memory element at least at the time of reading data. The semiconductor memory device is for reading data stored in the memory element by applying specified electric action to the compound element including the memory element and the supplemental element substantially electrically mutually associated. The semiconductor memory device is characterized in that the electric characteristic of the supplemental element is adapted to be variable based on a signal for changing the electric characteristic of the supplemental element so that data may be read free from troubles.

20 Claims, 13 Drawing Sheets

US 6,545,901 B2

SEMICONDUCTOR MEMORY DEVICE HAVING A SUPPLEMENTAL ELEMENT FOR READING DATA STORED IN A MEMORY ELEMENT

CROSS-REFERENCE TO RELATED APPLICATION

The entire disclosure of Japanese patent application No. 2000-280510 filed on Sep. 14, 2000 including specification, claims, drawings, and summary are incorporated herein by reference in its entirety.

BACKGROUND OF THE INVENTION

1. Field of the Invention

The present invention relates to semiconductor memory devices, in particular to a technique for accurately reading data from semiconductor memory devices.

2. Description of the Prior Art

Destruction type ferroelectric memories are known as the nonvolatile random access memory. FIG. 13 schematically shows part of the circuit constitution of a kind of conventional destruction type ferroelectric memory, a ferroelectric memory 2 of the 1T1C (one-transistor one-capacitor).

The ferroelectric memory 2 comprises a ferroelectric capacitor 4 and a loading capacitor 6. The ferroelectric capacitor 4 has stored data of "1" or "0" in nonvolatile manner corresponding to the difference in residual polarization arising from hysteresis characteristic of the ferroelectric.

When reading data, a reading-purpose voltage is applied to the plate line PL to detect a voltage Vb1 produced on the bit line BL. The value of the voltage Vb1 varies with the value of the residual polarization of the ferroelectric capacitor 4.

Therefore, whether the data stored in the ferroelectric capacitor 4 has been "1" or "0" can be found by judging whether the voltage Vb1 is higher or lower than a reference voltage Vref.

Nonvolatile random access memories may be fabricated easily as described above using the destructive type ferroelectric memory.

However, the conventional destructive type ferroelectric memory has the following problems: When data are read from the destructive type ferroelectric memory, data are destroyed and so the data must be written again.

After repeated accesses to the ferroelectric capacitor 4 causes the hysteresis characteristic of the ferroelectric capacitor 4 to deteriorate and the difference in the residual polarization values becomes small between when the data is 1 and when the data is 0. When the difference between the residual polarization values becomes small, difference becomes also small between the voltage Vb1 produced in the bit line and the reference voltage Vref when a data is read, and so it becomes difficult to judge whether or not the voltage Vb1 is greater than the reference voltage Vref.

When data contents are held unchanged for a long period of time, distortion occurs in the hysteresis characteristic of the ferroelectric capacitor 4 due to so-called imprint effect and so it is also difficult to judge whether or not the voltage Vb1 is greater than the reference voltage Vref.

When it becomes difficult to determine whether or not the voltage Vb1 is greater than the reference voltage Vref as described above, data cannot be read accurately.

SUMMARY OF THE INVENTION

A semiconductor memory device according to the present invention includes:

a memory capacitor for storing information; and a loading capacitor connected substantially in series with the memory capacitor at least at the time of reading data, to read data that have been stored in the memory capacitor according to the voltage produced at a connection point between the memory capacitor and the loading capacitor due to a reading voltage applied to both ends of the compound capacitor including the memory capacitor and the loading capacitor interconnected substantially in series, characterized in that the capacity of the loading capacitor is arranged to be variable based on a capacitance changing signal so that data are read free from troubles.

A semiconductor memory device according to the present invention includes:

a memory element for storing data; and a supplemental element substantially electrically associated with the memory element at least at the time of reading data, to read data stored in the memory element by applying specified electric action to a compound element including the memory element and the supplemental element substantially electrically mutually associated, characterized in that an electric characteristic of the supplemental element is adapted to be variable based on a signal for changing the electric characteristic of the supplemental element so that data are read without any trouble.

While the present invention may be broadly described above, its constitution and details together with its purpose and features will become more apparent from the following disclosure in reference to the appended drawings.

DESCRIPTION OF PREFERRED EMBODIMENTS

Figure 1:
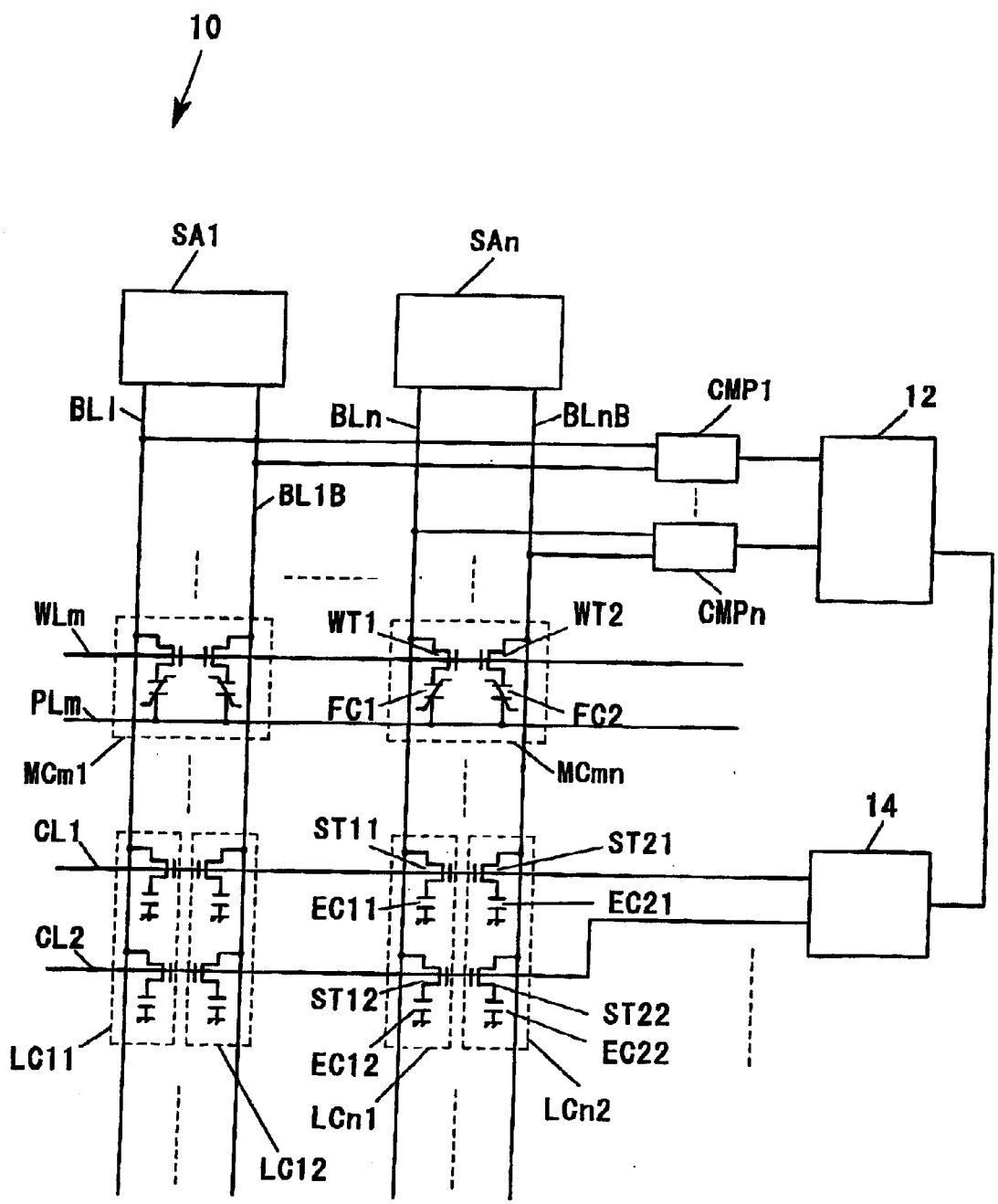
FIG. 1 shows part of the circuit constitution of a ferroelectric memory 10, a semiconductor memory device as an embodiment of the present invention.

FIG. 1 shows part of the circuit constitution of a ferroelectric memory 10, a semiconductor memory device as an embodiment of the present invention. The ferroelectric memory 10 is constituted with plural memory cells MC11, MC12, . . . , MCmn, . . . arranged in a matrix pattern. Since the plural memory cells MC11, MC12, . . . , MCmn, . . . are constituted similarly to each other, the constitution of the memory cell MCmn is described as an example.

The memory cell MCmn located in the m-th row in the n-th column is a so-called 2T2C (2-transistor 2-capacitor) type of memory cell comprising a pair of memory-purpose capacitors (memory purpose elements), namely ferroelectric capacitors FC1 and FC2.

The ferroelectric capacitors FC1 and FC2 are constituted to be in complementary polarized states. That is to say, they are constituted as follows: For example, when the polarized state of the ferroelectric capacitor FC1 is at P1 in FIG. 3, the polarized state of the ferroelectric capacitor FC2 is at P2 in FIG. 3.

Figure 3:
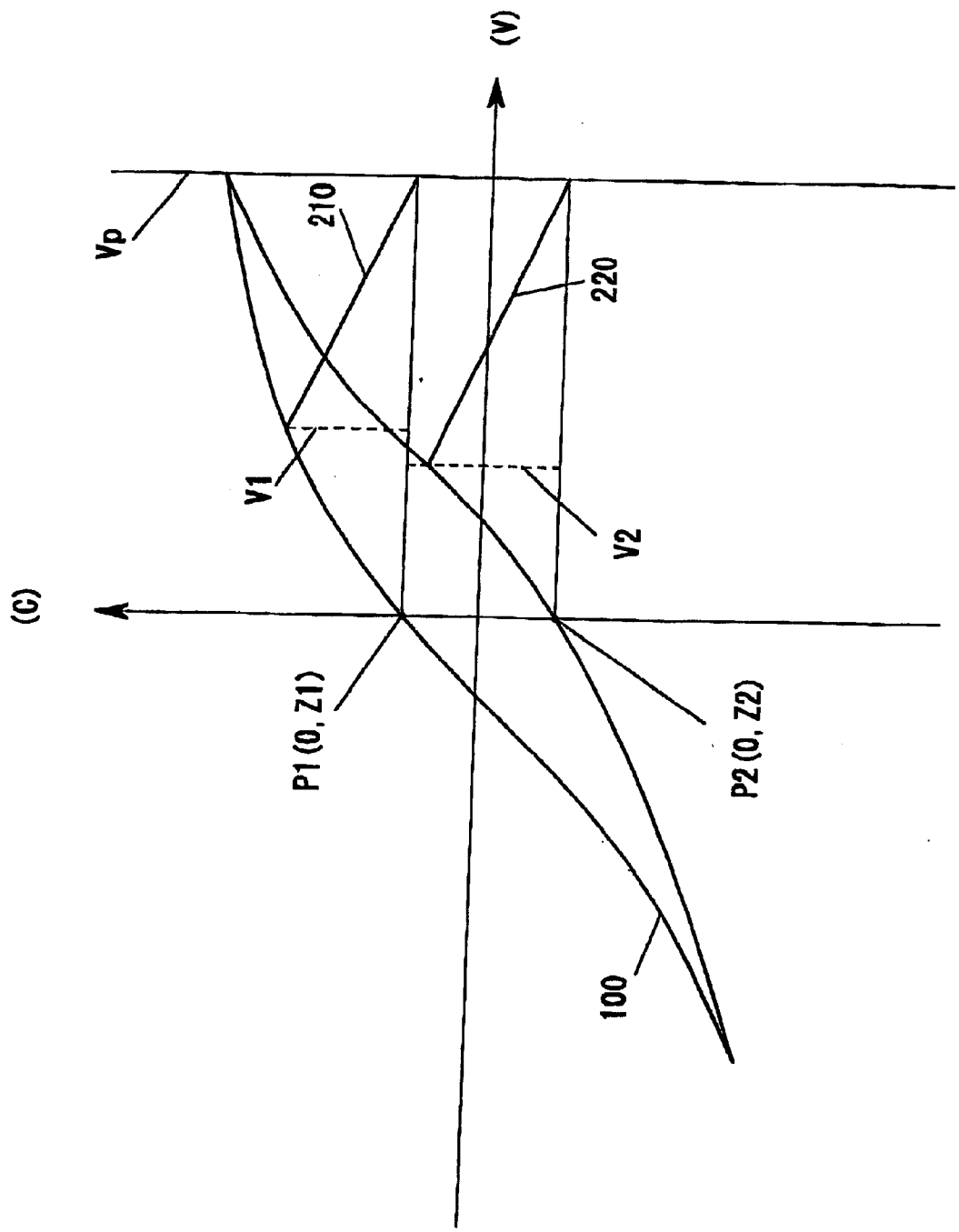
FIG. 3 is for explaining the operation of the ferroelectric memory 10 and the ferroelectric memory 20.

In contrast for example, when the polarized state of the ferroelectric capacitor FC1 is at P2 in FIG. 3, the polarized state of the ferroelectric capacitor FC2 is at P1 in FIG. 3.

The ends on one side of the ferroelectric capacitors FC1 and FC2 are both connected to the plate line PLm. Although not shown, the ends on one side of the ferroelectric capacitors FC1 and FC2 of other memory cells belonging to the m-th row are connected to the plate line PLm.

The ends on the other side of the ferroelectric capacitors FC1 and FC2 are respectively connected to the paired bit lines BLn and BLnB in the n-th column through transistors WT1 and WT2. Although not shown, the ends on the other side of other ferroelectric capacitors constituting the n-th column are also connected to the paired bit lines BLn and BLnB in the n-th column respectively through paired transistors.

A sensing amplifier SAn for the n-th column is connected to the paired bit lines BLn and BLnB in the n-th column.

The gates of the transistors WT1 and WT2 are connected to the word line WLm in the m-th row. Although not shown, gates of paired transistors of other memory cells belonging to the m-th row are also connected to the word line WLm.

A comparator CMPn for measuring a data judgment voltage, a differential potential produced between the paired bit lines BLn and BLnB in the n-th column at the time of reading data is connected to the paired bit lines BLn and BLnB. Other comparators (not shown) are also connected likewise to other pairs of bit lines.

The output ends of the comparators CMP1, . . . , CMPn are connected to the input terminals of a low potential detecting section 12. The output terminal of the low potential detecting section 12 is connected to the input terminal of a loading capacitor control section 14 to be described later.

As shown in FIG. 1, one side ends of element capacitors EC11, EC12, . . . are connected to the bit line BLn through transistors ST11, ST12, . . . Other side ends of the capacitors EC11, EC12, . . . are all grounded. A loading-purpose capacitor LCn1 (supplementary element) is constituted with the element capacitors chosen with the loading capacitor control section 14 out of the element capacitors EC11, EC12, . . . Other loading capacitors LCn2, . . . (supplementary elements) are also constituted similarly to the loading capacitor LCn1.

Transistors ST11, ST21, . . . connected to the corresponding element capacitors EC11, EC21, . . . out of the capacitors constituting the loading capacitors LCn1, LCn2, . . . are connected to the loading capacitor control section 14 through a control line CL1.

Likewise, transistors ST12, ST22, . . . connected to other corresponding element capacitors EC12, EC22, . . . out of the element capacitors constituting the loading capacitors LCn1, LCn2, . . . are connected to the loading capacitor control section 14 through a control line CL2. Other corresponding element capacitors are arranged likewise.

Capacitance values of the corresponding element capacitors are identical. In the present embodiment, the capacitance value of corresponding element capacitors is different from that of other corresponding element capacitors. For example, the capacitance value of the capacitors EC12, EC22, . . . is set to be twice that of the capacitors EC11, EC21, . . .

It is constituted that only the control line CL1 is at "H" in the initial state. That is, only the transistors ST11, ST21, . . . are turned on. Therefore, in the initial state, only the element capacitor EC11 constitutes the loading capacitor LCn1 of the bit line BLn, and only the element capacitor EC21 constitutes the loading capacitor LCn2 of the bit line BLnB. The same applies to other bit lines.

Next, the operation of the ferroelectric memory 10 shown in FIG. 1 is described. First, as an example, operation when reading data from a specific memory cell MCmn is described. It is assumed that polarized states of the ferroelectric capacitors FC1 and FC2 constituting the memory cell MCmn are respectively at P1 and P2 in FIG. 3. This state is defined as the state in which a data "1" is stored in the memory cell MCmn.

Here, FIG. 3 shows the relationship between voltage (horizontal axis) and polarized state (vertical axis; the drawing shows the state with the electric charge equivalent to the polarized state) in the ferroelectric capacitor FC1 (or FC2). The relationship for the ferroelectric capacitor FC1 (or FC2) is depicted using the hysteresis curve 100. Here, the ferroelectric capacitors FC1 and FC2 are assumed to have almost the same characteristic and so the single hysteresis curve 100 is used for convenience to represent both.

After discharging the loading capacitors LCn1 and LCn2 (namely the capacitors EC11 and EC21 in the initial state) according to a predetermined method, the paired bit lines BLn and BLnB are set to floating state. After that, the word line WLm is set to "H" to turn on the transistors WT1 and WT2. After that, a reading voltage Vp is applied to the plate line PL.

In other words, the loading capacitor LCn1 and the ferroelectric capacitor FC1 are connected in series to form in effect a compound capacitor, and a differential voltage Vp is applied across both ends of the compound capacitor. Similarly, the loading capacitor LCn2 and the ferroelectric capacitor FC2 are connected in series to form in effect a compound capacitor and a differential voltage Vp is applied across both ends of the compound capacitor.

Here, the voltages produced across both ends of the ferroelectric capacitors FC1 and FC2 are graphically determined to be V1 and V2 in FIG. 3. Here, two straight lines 210 and 220 represent the loading capacitors LCn1 and LCn2. In other words, the gradients of the two straight lines 210 and 220 represent the capacities of the loading capacitors LCn1 and LCn2, respectively. Incidentally, since the capacities of the loading capacitors LCn1 and LCn2 are identical, the gradients of the two straight lines 210 and 220 are identical.

Referring to the graph, the voltages produced at the loading capacitors LCn1 and LCn2, or the voltages appearing at the bit lines BLn and BLnB, are expressed as Vp−V1 and Vp−V2, respectively.

The value of the data stored in the memory cell MCmn is found by discriminating which of the voltages appearing on the bit lines BLn and BLnB is greater using the sensing amplifier SAn in the n-th row. In the present embodiment, the data is assumed to be "1" when the voltage (Vp−V2) appearing on the bit line BLnB is greater than the voltage (Vp−V1) appearing on the bit line BLn, and the data is assumed to be "0" when the comparative relation is reversed. Therefore, as seen from FIG. 3, the data stored in the memory cell MCmn is found to be "1."

In this embodiment, the capacitance values of the element capacitors EC11 and EC21 are set so that the differential voltage value (V1−V2) between the bit lines when the data "1" is stored is positive and that the value is slightly greater than the detection limit of the sensing amplifier. Therefore, the voltages to be applied to the ferroelectric capacitors FC1 and FC2 can be held low during reading operation. As a result, the ferroelectric capacitors FC1 and FC2 are less likely to deteriorate due to repeated reading operations even in the initial state.

Deterioration of the ferroelectric capacitors FC1 and FC2 is prevented to some extent in the initial state as described above. In case the deterioration still occurs and the value (V1−V2) becomes smaller than the detection limit of the sensing amplifier, the capacitance values of the loading capacitors LCn1 and LCn2 are changed as will be described later so that the value (V1−V2) becomes greater than the detection limit of the sensing amplifier.

Referring to FIG. 1 again, when the sensing amplifier SAn detects V1>V2, the bit lines BLn and BLnB are set respectively to logical "L" and "H" levels. Through the actions from reading the level setting, the data destroyed by the reading action are restored. The action of restoring the data destroyed by reading is called the rewriting action.

Figure 4:
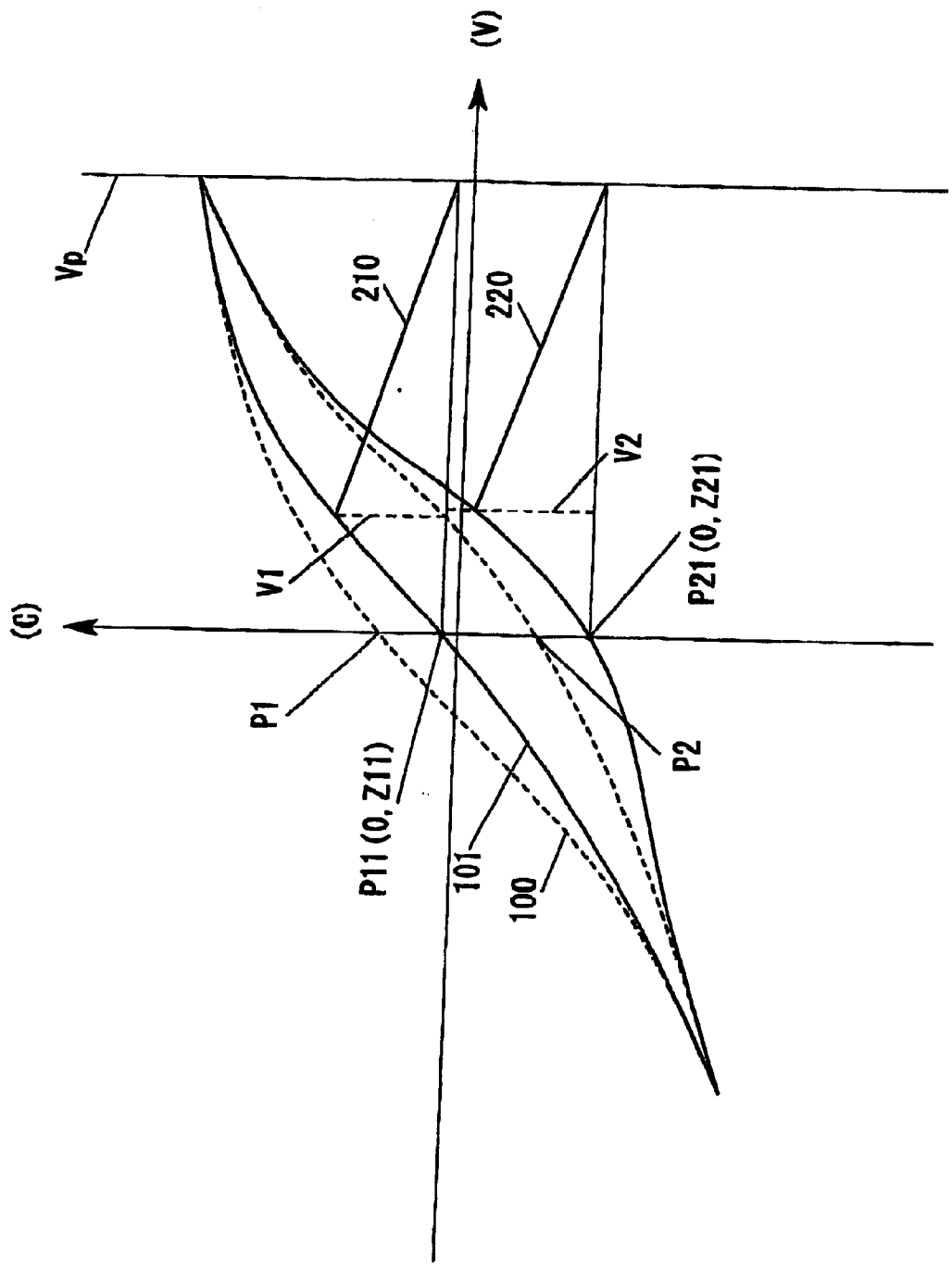
FIG. 4 is for explaining the operation of the ferroelectric memory 10 and the ferroelectric memory 20.

Incidentally, when the same data are held in the memory cell MCmn for a long period of time, hysteresis curves 100 of the ferroelectric capacitors FC1 and FC2 are deformed by the imprinting effect. FIG. 4 shows how the hysteresis curve 100 is changed to the hysteresis curve 101 by the imprinting effect.

When the hysteresis curve 100 (in the initial state) is changed to the hysteresis curve 101, as shown in FIG. 4 for example, the absolute value of the differential potential (V1−V2) between the paired bit lines BLn and BLnB decreases and its sign is reversed. In such a situation, data cannot be read correctly.

In view of the above, in this embodiment as shown in FIG. 1, a low voltage detecting section 12 monitors the differential potential (V1−V2) between the paired bit lines BLn and BLnB through a comparator CMPn.

The low voltage detecting section 12 is constituted to produce a capacitance changing signal when the differential potential (V1−V2) between the paired bit lines BLn and BLnB becomes smaller than a preset voltage.

When a capacitance changing signal is issued from the low voltage detecting section 12, the loading capacitor control section 14 sets the control line CL1 currently at "H" level to "L" level and sets the control line CL2 currently at "L" level to "H" level. As a result, element capacitors constituting the loading capacitors LCn1 and LCn2 are changed from the element capacitors EC11 and EC21 to the element capacitors EC12 and EC22.

As described above, this embodiment is arranged such that the capacitance value of the capacitors EC12, EC22, . . . are set twice that of the capacitors EC11, EC21, . . . Therefore, the capacitance value of the loading capacitors LCn1 and LCn2 also becomes twice that before being changed.

Figure 5:
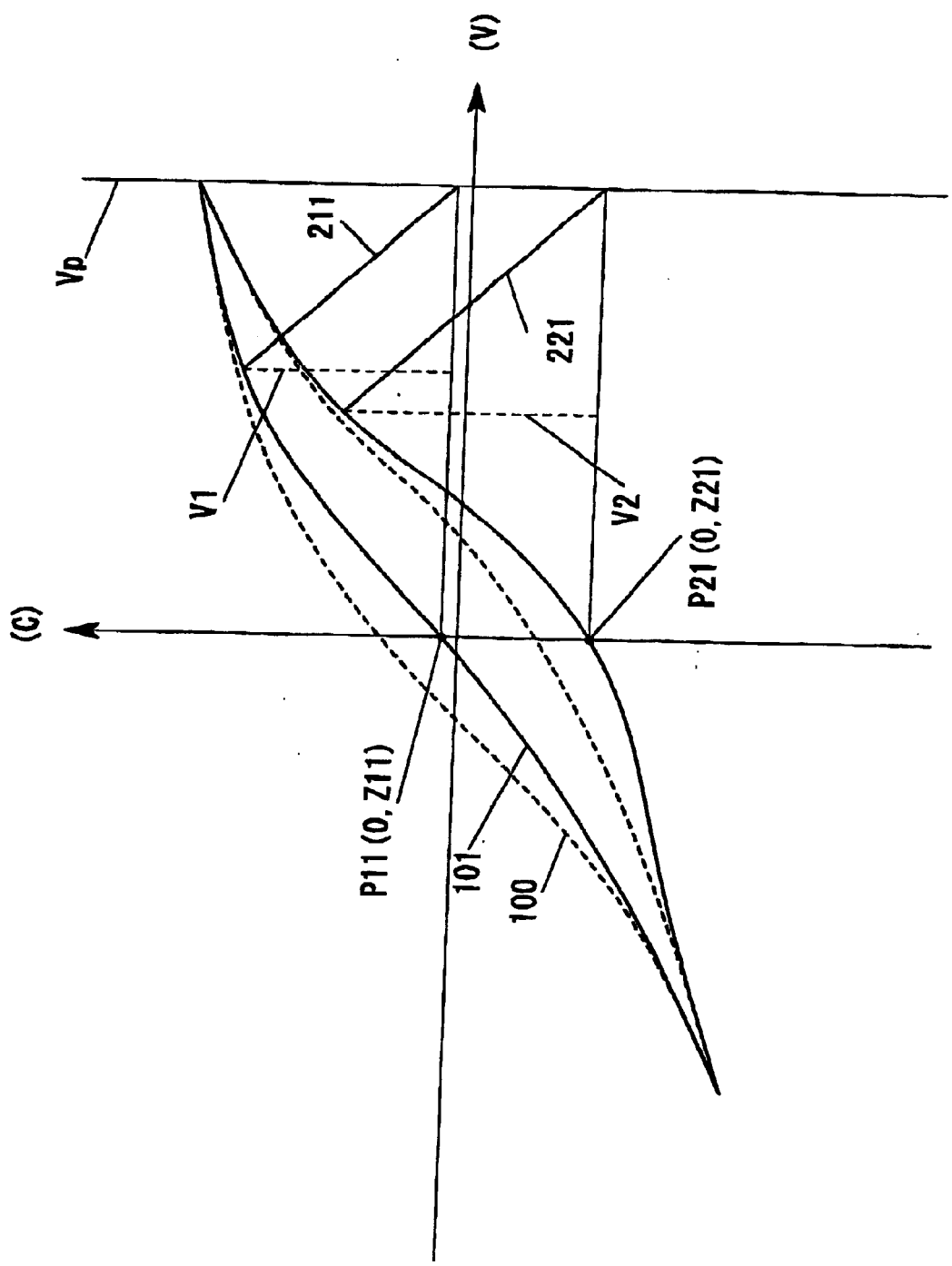
FIG. 5 is for explaining the operation of the ferroelectric memory 10 and the ferroelectric memory 20.

FIG. 5 shows straight lines 211 and 221 for the loading capacitors LCn1 and LCn2 after being changed. As seen from FIG. 5, the differential potential (V1−V2) between the paired bit lines BLn and BLnB at the time of reading data is positive again and that absolute value is restored almost to the initial state shown in FIG. 1.

Thus, changing the capacitance values of the loading capacitors LCn1 and LCn2 makes it possible to read data without any problem even when the hysteresis curve 100 is changed as shown with the hysteresis curve 101 by the imprint effect.

With the type of memory device such as the ferroelectric memory 10 of the above embodiment for performing the destructive reading, the data destroyed by reading must be restored as described above. After repeated reading actions, the hysteresis characteristic of the ferroelectric capacitors FC1 and FC2 deteriorates by fatigue.

Figure 6:
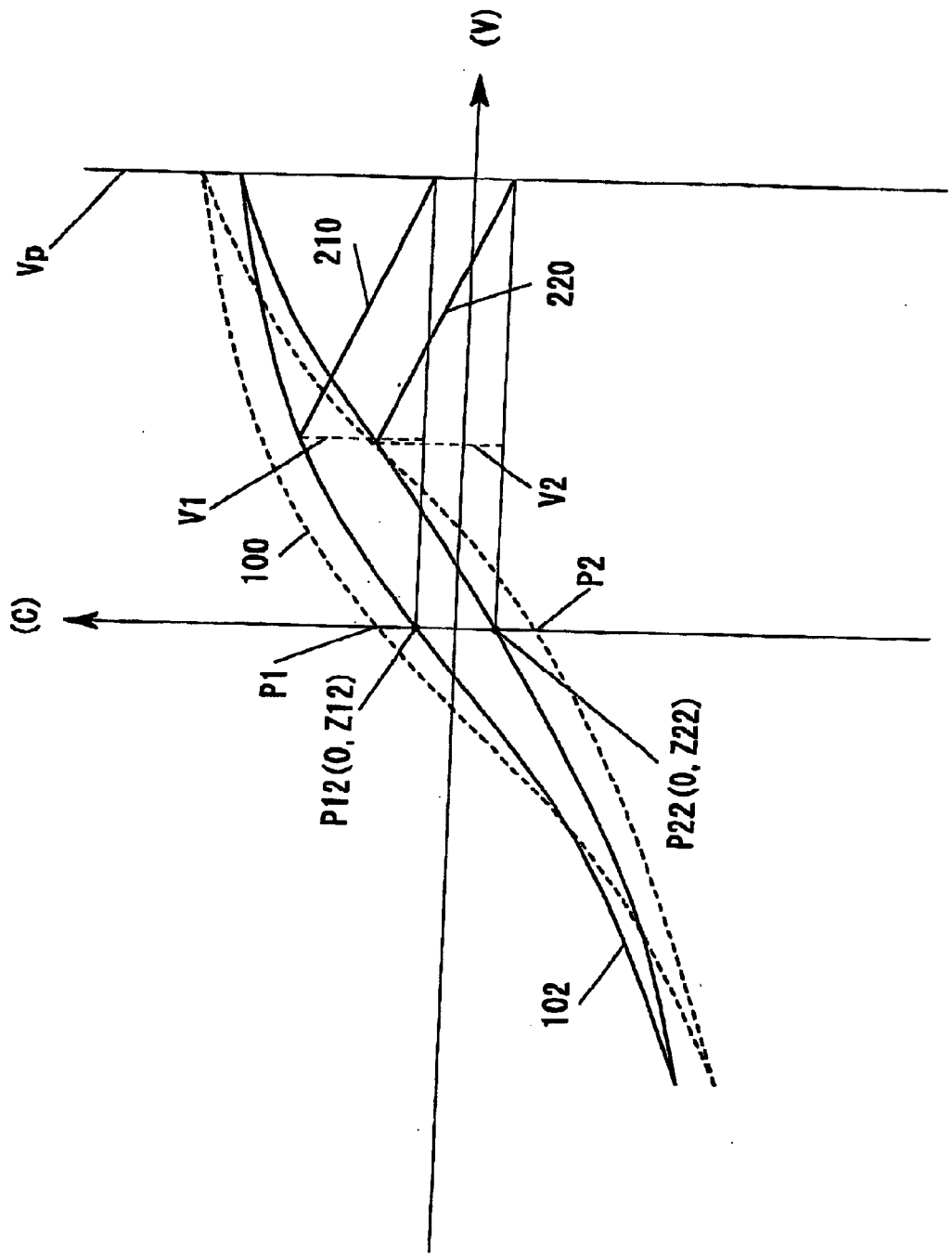
FIG. 6 is for explaining the operation of the ferroelectric memory 10 and the ferroelectric memory 20.

FIG. 6 shows hysteresis curves 102 of the ferroelectric capacitors FC1 and FC2 as deteriorated by fatigue. Once the hysteresis curve 100 (in the initial state) changes to the hysteresis curves 102, it becomes also difficult to accurately read a data "1" for example because the absolute value of the differential potential (V1−V2) between the paired bit lines BLn and BLnB is small at the time of reading data.

Since this embodiment is arranged such that the low voltage detecting section 12 is monitoring the differential potential (V1−V2) between the paired bit lines BLn and BLnB through the CMPn, even if the hysteresis characteristic of the ferroelectric capacitors FC1 and FC2 deteriorates due to fatigue, the decrease in the differential potential (V1−V2) associated with the deterioration is detected and the capacitance values of the loading capacitors LCn1 and LCn2 are changed.

Figure 7:
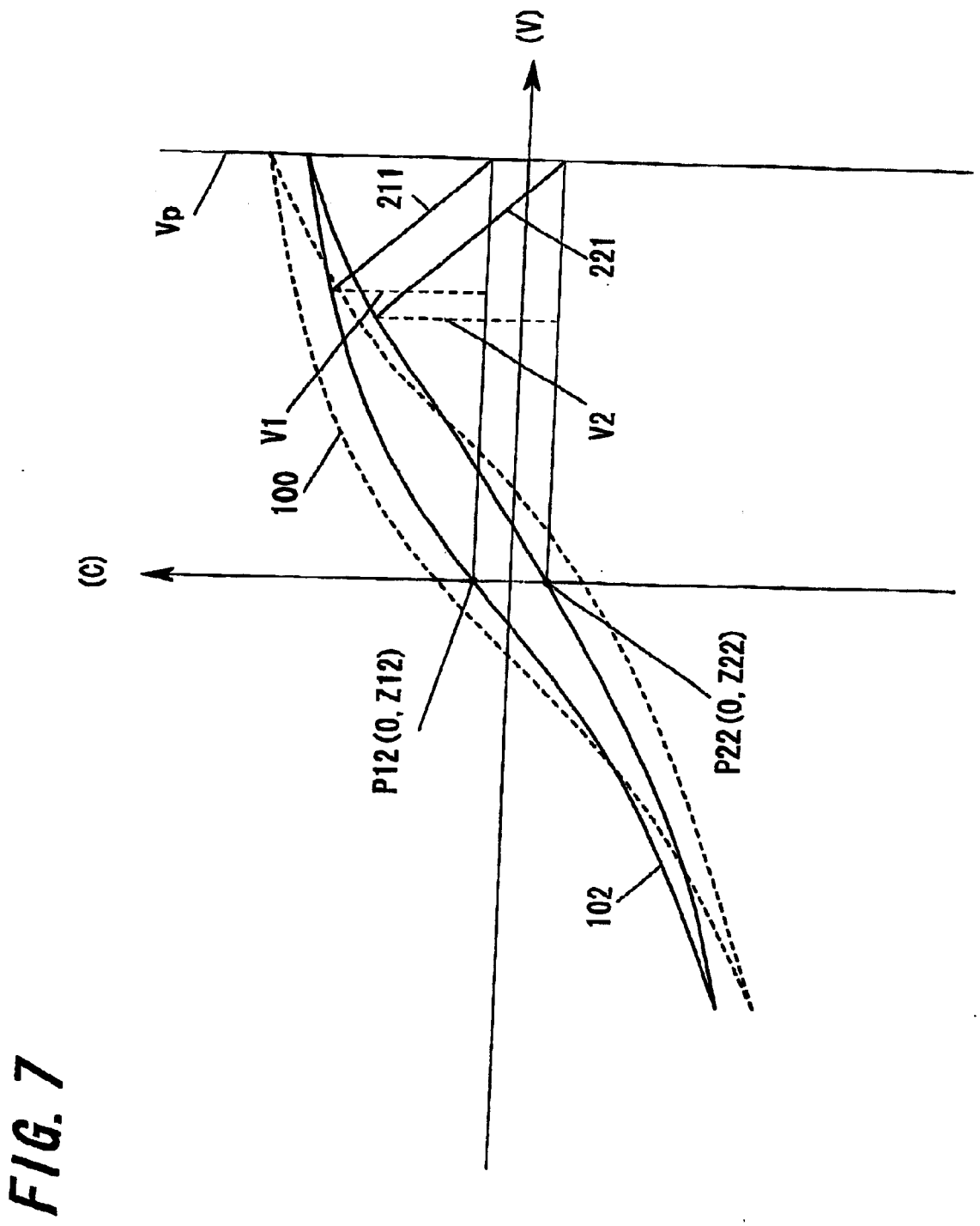
FIG. 7 is for explaining the operation of the ferroelectric memory 10 and the ferroelectric memory 20.

FIG. 7 shows straight lines 211 and 221 for the loading capacitors LCn1 and LCn2 after the change. As seen from FIG. 7, the differential potential (V1−V2) between the paired bit lines BLn and BLnB at the time of reading data is restored almost to the initial state shown in FIG. 1.

Thus, changing the capacitance values of the loading capacitors LCn1 and LCn2 makes it possible to read data without any problem even when the hysteresis curve 100 is changed as shown with the hysteresis curve 102 by fatigue.

As described above, the ferroelectric memory 10 shown in FIG. 1 is arranged to detect the decrease in the differential potential (V1−V2) between the paired bit lines BLn and BLnB at the Lime of reading data and to change the capacitance values of the loading capacitors LCn1 and LCn2. Therefore, whatever the cause of the change (deterioration) in the hysteresis characteristics of the ferroelectric capacitors FC1 and FC2 may be, difficulty in reading data is detected to automatically change the capacitance values of the loading capacitors LCn1 arid LCn2, so that data are read accurately.

As a matter of course, it is also possible to arrange, in case the data judgment voltage decreases again after changing the capacitance values of the loading capacitors LCn1 and LCn2, to detect the decrease and change again the capacitance values of the loading capacitors LCn1 and LCn2.

Figure 2:
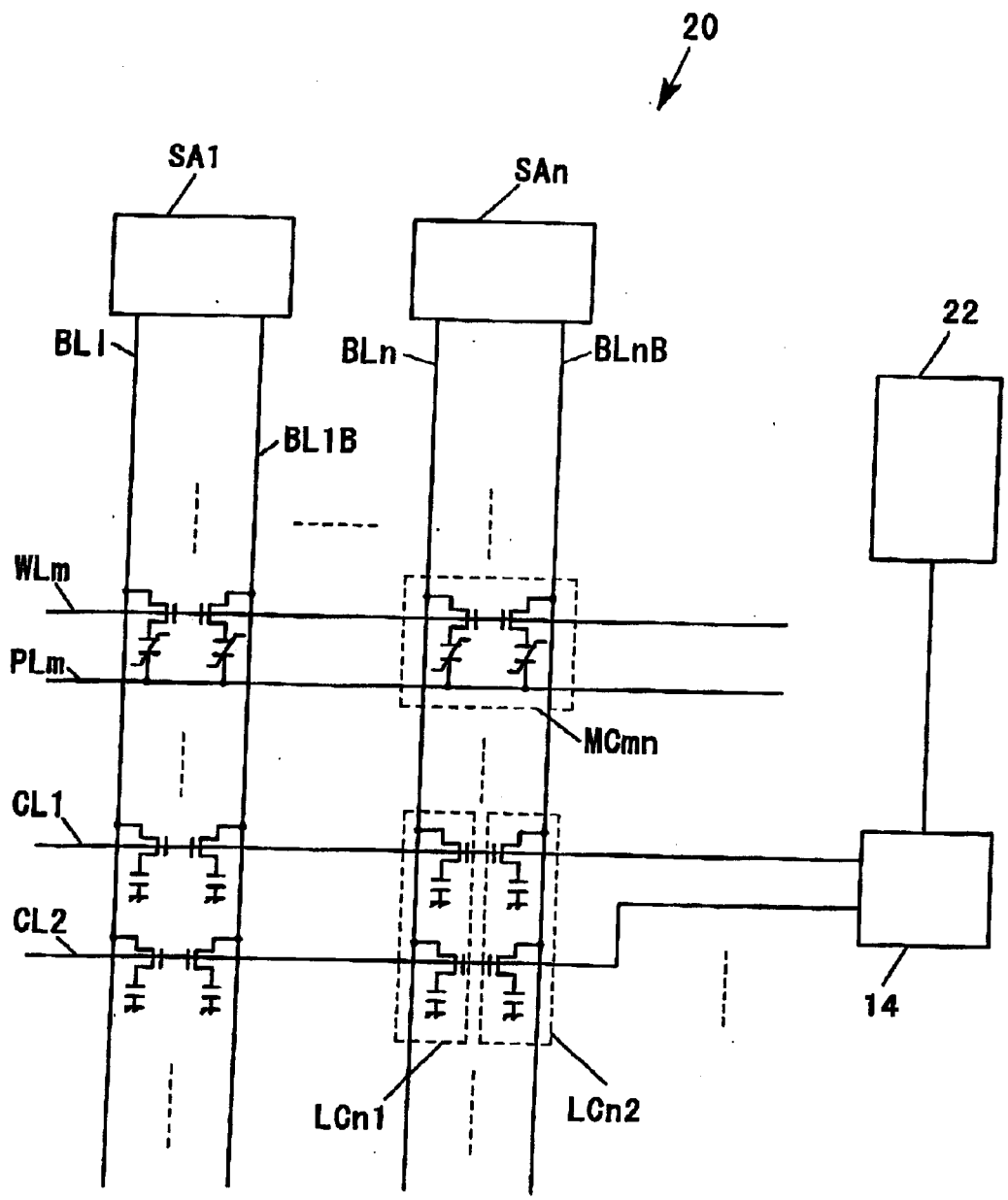
FIG. 2 shows part of the circuit constitution of a ferroelectric memory 20, a semiconductor memory device as another embodiment of the present invention.

Next, FIG. 2 shows part of the circuit constitution of a semiconductor memory device, a ferroelectric memory 20, as another embodiment of the present invention. The circuit constitution of the ferroelectric memory 20 is similar to that of the ferroelectric memory 10 shown in FIG. 1 above. However, the ferroelectric memory 20 of FIG. 2 is not provided with comparators CMP1, ..., CMPn, ... and the low voltage detecting section 12, but instead is provided with an access number detecting section 22.

The access number detecting section 22 monitors the number of accesses to the ferroelectric memory 20, the sum of the number of reading data and the number of writing data.

The access number detecting section 22 is arranged to issue a capacitance changing signal when it detects that the number of accesses to the ferroelectric memory 20 reaches a preset number. While the preset number of accesses is not limited to a specific value, the number is preferably set to a value that is slightly smaller than a value at which reading data is considered to be difficult on the basis of experience or calculation.

Similar to the above case of the ferroelectric memory 10 shown in FIG. 1, the loading capacitor control section 14, upon receiving the capacitance changing signal that is produced, replaces the element capacitors EC11 and EC21 constituting the loading capacitors LCn1 and LCn2 with the capacitors EC12 and EC22.

Thus, the embodiment shown in FIG. 2 is arranged to change the capacitance values of the loading capacitors LCn1 and LCn2 on condition that the number of accesses reaches a preset value. Therefore, the capacitance values of the loading capacitors LCn1 and LCn2 are changed automatically to enable accurate reading again with a simple constitution of counting the number of accesses.

As a matter of course, it is also possible to arrange, in case the number of accesses reaches again a preset value after changing the capacitance values of the loading capacitors LCn1 and LCn2, to change again the capacitance values of the loading capacitors LCn1 and LCn2.

Next, FTC. 8 shows part of the circuit constitution of a semiconductor memory device, a ferroelectric memory 30, as still another embodiment of the present invention. The circuit constitution of the ferroelectric memory 30 is similar to that of the ferroelectric memory 10 shown in FIG. 1 above. However, in the ferroelectric memory 30 in FIG. 8, the memory cell MCmn located in the m-th row in the n-th column is of a so-called 1T1C (one-transistor one-capacitor) type, comprising a memory-purpose capacitor, a ferroelectric capacitor FC.

The end on one side of the ferroelectric capacitor FC is connected to the plate line PLm. Although not shown, ends on the same one side of ferroelectric capacitors of other memory cells belonging to the m-th row are connected to the plate line PLm.

The end on the other side of the ferroelectric capacitor FC is connected to the bit line BLnB in the n-th column through a transistor WT. The ends on the same other side of other ferroelectric capacitors of other memory cells (not shown) are respectively connected to the bit line BLnB in the n-th column.

The ferroelectric memory 30 has reference cells RC1, ..., RCn, ..., one in each column of the matrix. The reference cells RC1, ..., RCn, ... in this embodiment are paraelectric capacitors. One side ends of the reference cells RC1, ..., RCn, ... are connected to an output line to which the plate lines PL1, ..., PLm, PLm+1, ... are OR-connected. The other side ends of the reference cells RC1, ..., RCn, ... are connected to other bit lines BL1, ..., BLn, ... of respective columns through transistors. Those transistors are constantly turned on.

The gate of the transistor WT is connected to the word line WLm of the m-th row. The gates of other transistors (not shown) of the memory cells belonging to the m-th row are also connected to the word line WLm. Rest of the constitution is nearly the same as that of the ferroelectric memory 10 shown in FIG. 1.

Figure 10:
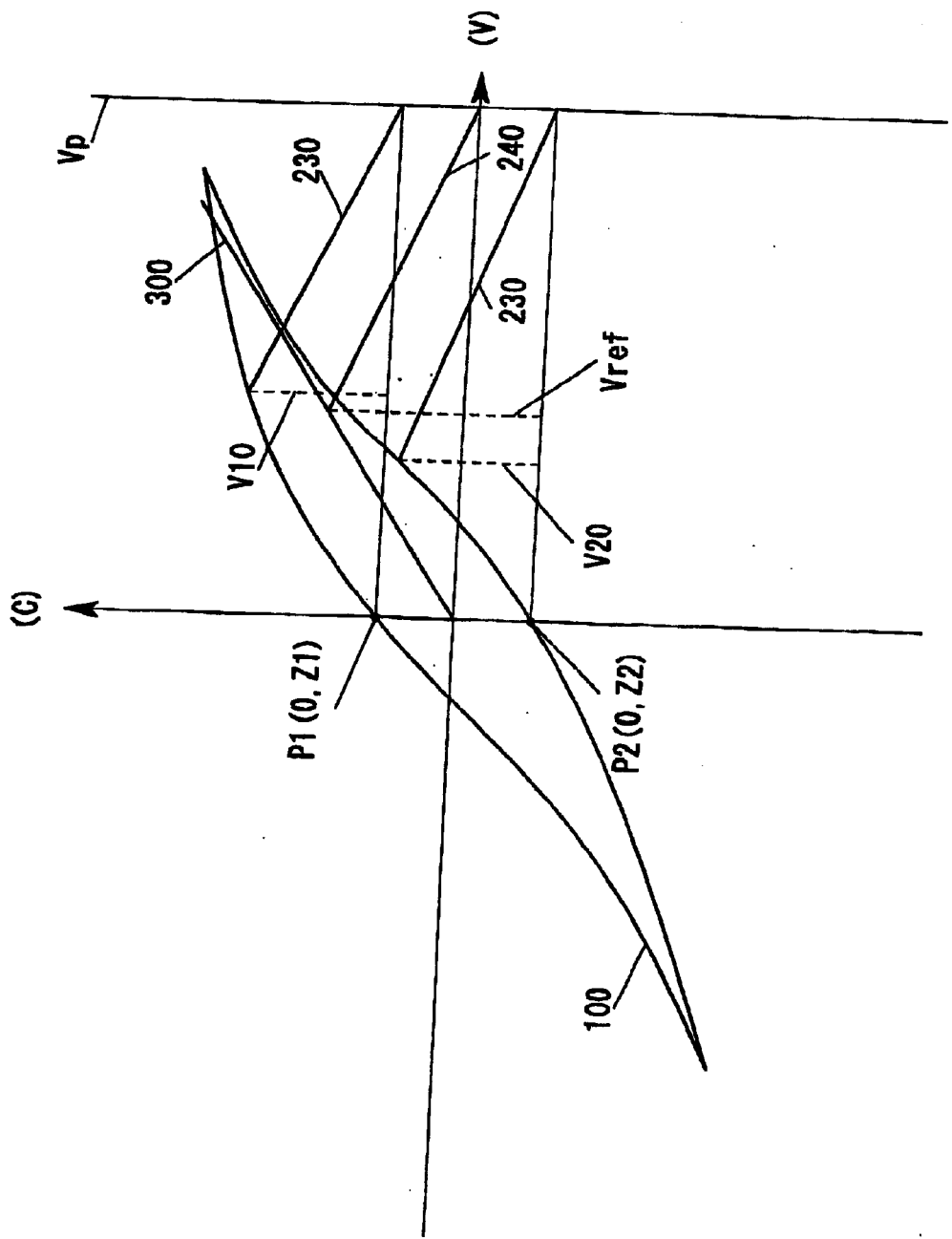
FIG. 10 is for explaining the operation of the ferroelectric memory 30 and the ferroelectric memory 40.

The ferroelectric capacitor FC in ordinary state can take either the polarized state P1 or P2 shown in FIG. 10. For example, if the polarized state P1 is defined to be the state of storing a data "1," the polarized state P2 is the state of storing a "0."

In FIG. 10, the straight line 300 represents for example the reference cell RCn. Namely the gradient of the straight line 300 represents the capacitance value of the reference cell RCn. The straight line 240 represents the loading capacitor LCn1 of the bit line BLn on the reference cell RCn side. That is, the gradient of the straight line 240 represents the capacitance value of the loading capacitor LCn1.

Figure 8:
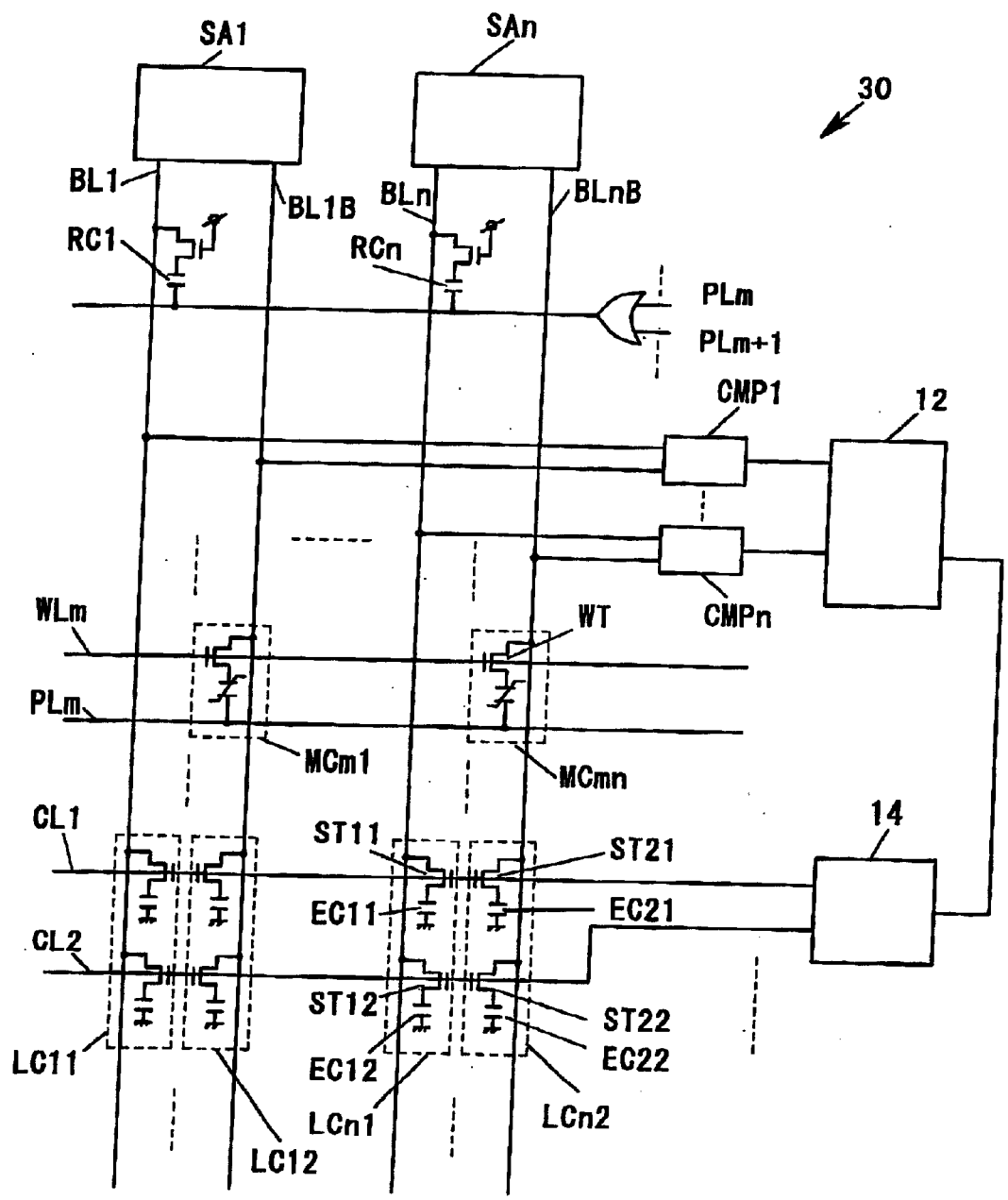
FIG. 8 shows part of the circuit constitution of a ferroelectric memory 30, a semiconductor memory device as still another embodiment of the present invention.

Therefore, the voltage appearing in the bit line BLn shown in FIG. 8 at the time of reading data is graphically determined to be (Vp−Vref) shown in FIG. 10. The voltage is called a reference voltage.

On the other hand in FIG. 10, the straight line 230 represents the loading capacitor LCn2 of the bit line BLnB on the side of ferroelectric capacitor FC shown in FIG. 8. That is, the gradient of the straight line 230 represents the capacitance value of the loading capacitor LCn2.

Therefore, according to graphical solution, the voltages appearing on the bit line BLnB shown in FIG. 8 at the time of reading data are (Vp−V10) shown in FIG. 10 when a data "1" is stored and (Vp−V20) when a data "0" is stored.

The sensing amplifier SAn learns the details of the data stored in the memory cell MCmn by determining whether or not the voltage (Vp−V11) or (Vp−V20) appearing on the bit line BLnB is greater than the voltage (Vp−Vref) appearing on the bit line BLn.

In this embodiment, it is assumed that the stored data is "1" when the voltage appearing on the bit line BLnB is smaller than the voltage (Vp−Vref) appearing on the bit line BLn, and otherwise "0."

Figure 11:
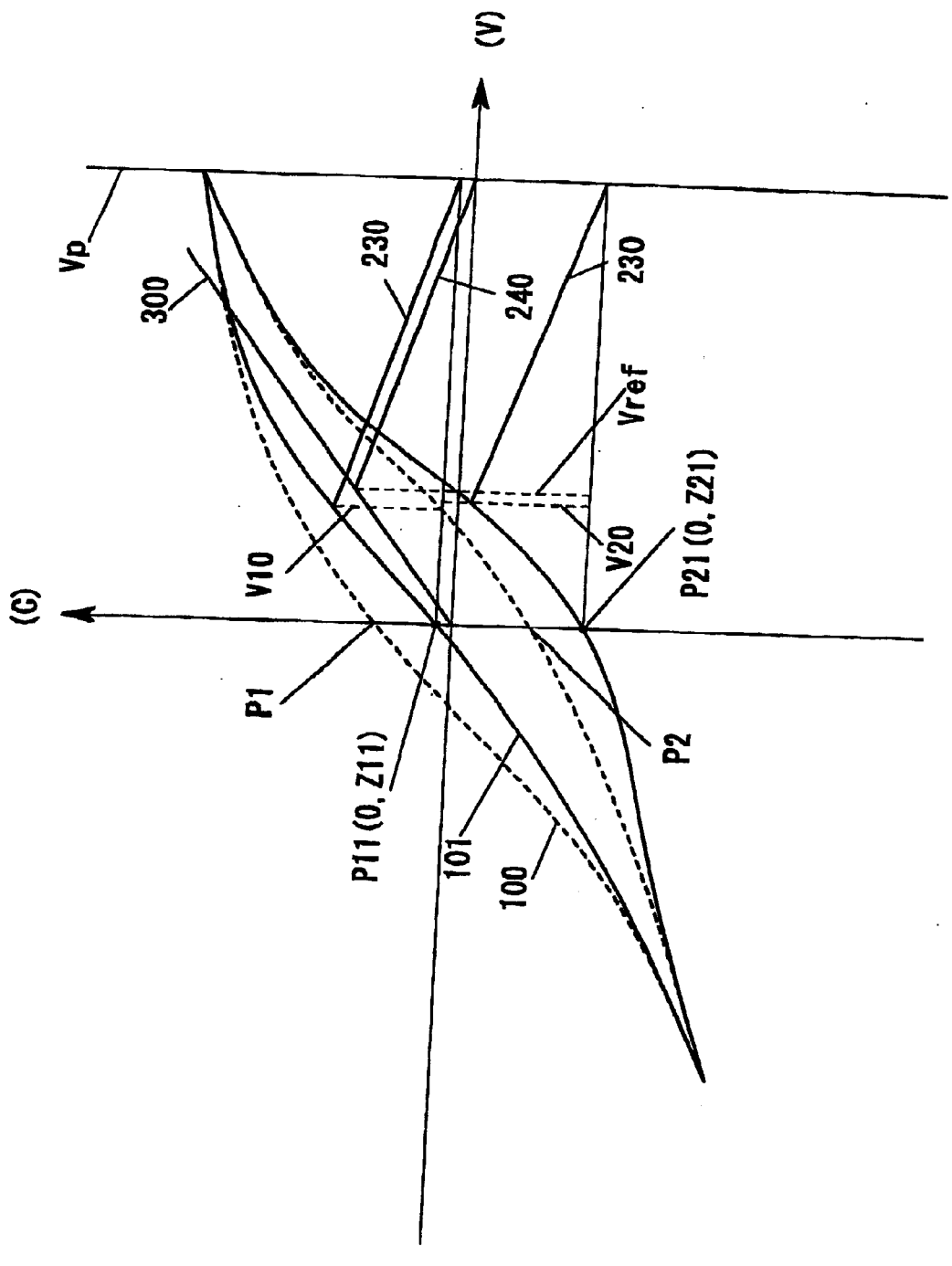
FIG. 11 is of explaining the operation of the ferroelectric memory 30 and the ferroelectric memory 40.

Likewise with the embodiment shown in FIG. 1, when the same data is retained in the memory cell MCmn for a long period of time, the hysteresis curve 100 of the ferroelectric capacitor FC changes undesirably due to the imprint effect and fatigue. FIG. 11 shows how the hysteresis curve 100 changes to the hysteresis curve 101 due to the imprint effect.

When the hysteresis curve 100 (initial state) changes undesirably to the hysteresis curve 101, as shown in FIG. 11 for example, the absolute value of the differential potential between the paired bit line BLn and BLnB at the time of reading data "1" decreases and, on top of that, the sign is reversed.

Also, the absolute value of the differential potential between the paired bit line BLn and BLnB at the time of reading a data "0" decreases. Thus, the data cannot be read accurately.

In view of the above, this embodiment is arranged similarly to the embodiment shown in FIG. 1 that the low voltage detecting section 12 monitors the differential potential between the paired bit line BLn and BLnB through the comparator CMPn, and that a capacitance changing signal is issued when the differential potential decreases below a preset value.

Similarly to the case with the embodiment shown in FIG. 1, when a capacitance changing signal is issued at the low voltage detecting section 12, the loading capacitance control section 14 changes the capacitance values of the loading capacitors LCn1 and LCn2 by changing the element capacitors that constitute the loading capacitors LCn1 and LCn2.

Figure 12:
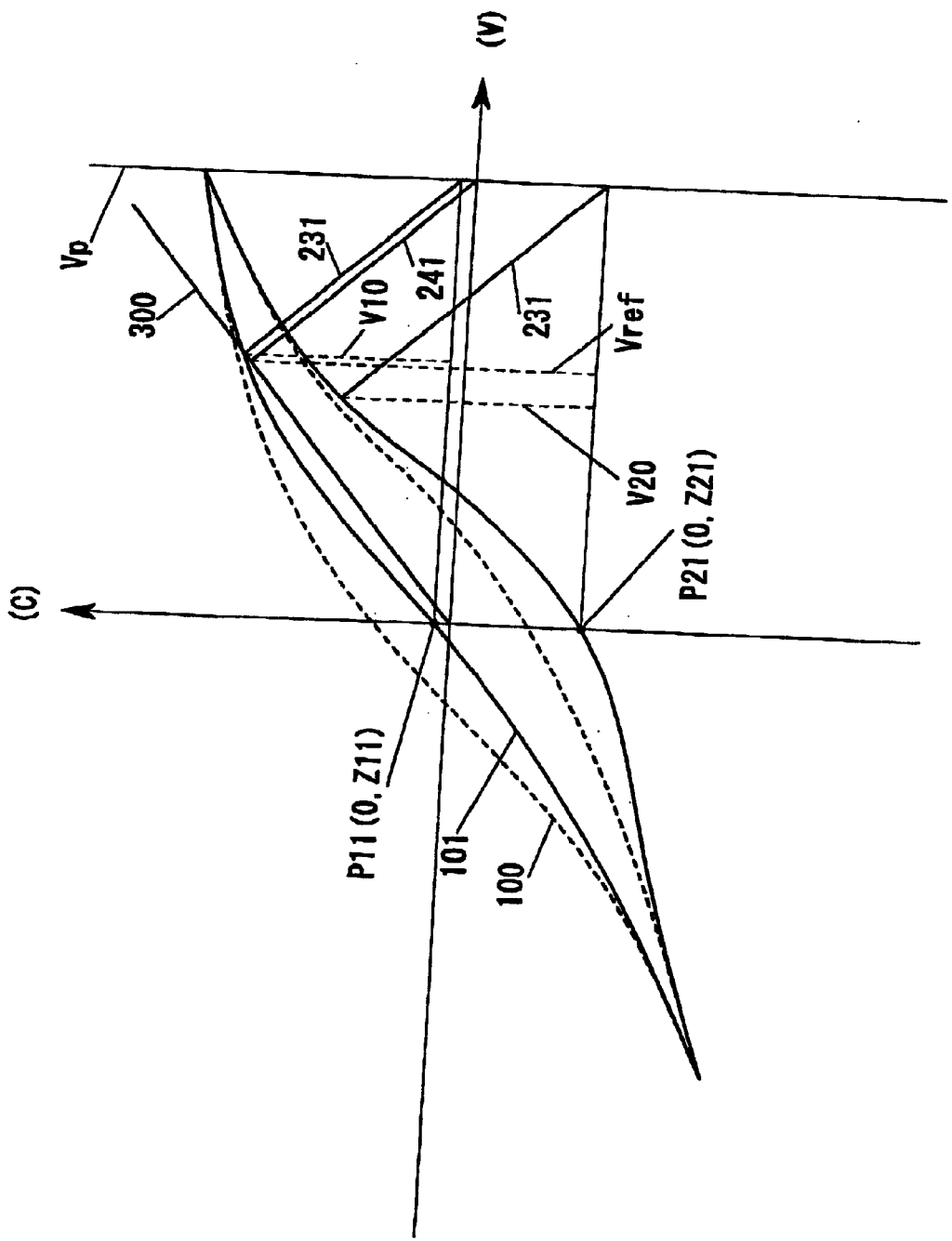
FIG. 12 is for explaining the operation of the ferroelectric memory 30 and the ferroelectric memory 40.
Figure 13:
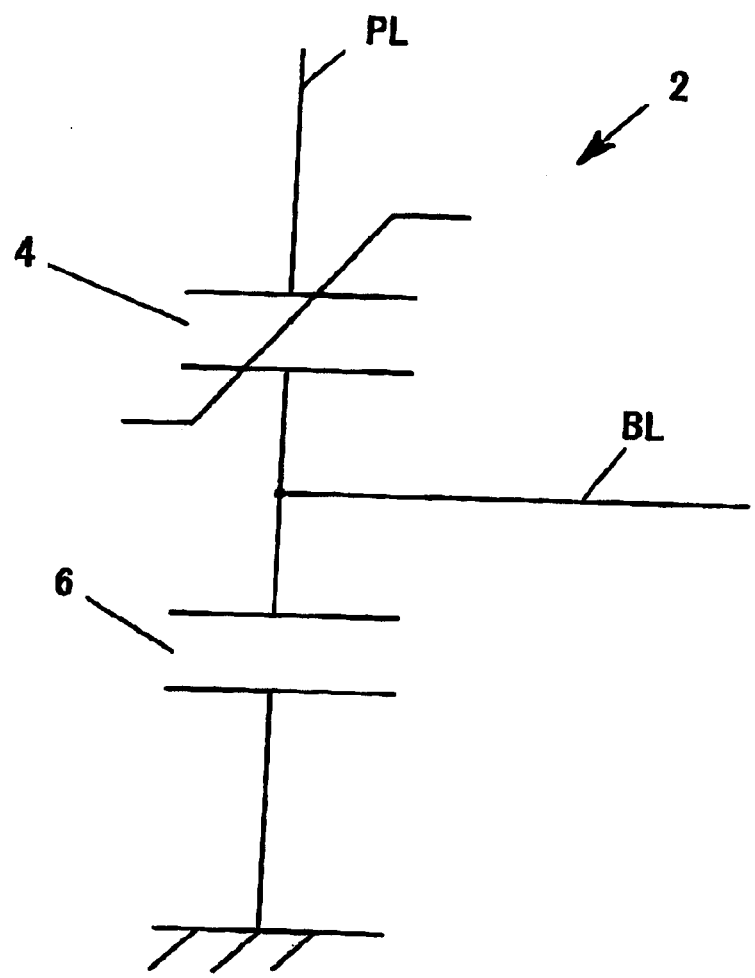
FIG. 13 schematically shows part of the circuit constitution of a conventional ferroelectric memory 2.

FIG. 12 shows straight lines 241 and 231 representing the changed loading capacitors LCn1 and LCn2. As seen from FIG. 12, the absolute value of the differential potential between the paired bit line BLn and BLnB at the time of reading a data "1" or "0" is restored to about the same magnitude as in the initial stale shown in FIG. 10.

Thus, also with the 1T1C type of ferroelectric memory 30, data can be read without any problem by changing the capacitance values of the loading capacitors LCn1 and LCn2 even if the hysteresis curve 100 changes due to the imprint effect or the like.

While the above embodiment is described with an example constitution of the reference cell RCn using paraelectric capacitors, the present invention is applicable to the case of constituting the reference cell RCn using ferroelectric capacitors.

While the above embodiment is described as being constituted that also the capacitance value of the loading capacitor LCn1 of the bit line BLn to which the reference cell RCn is connected is changed, it is also possible to arrange that the capacitance value of the loading capacitor LCn1 is not changed.

Figure 9:
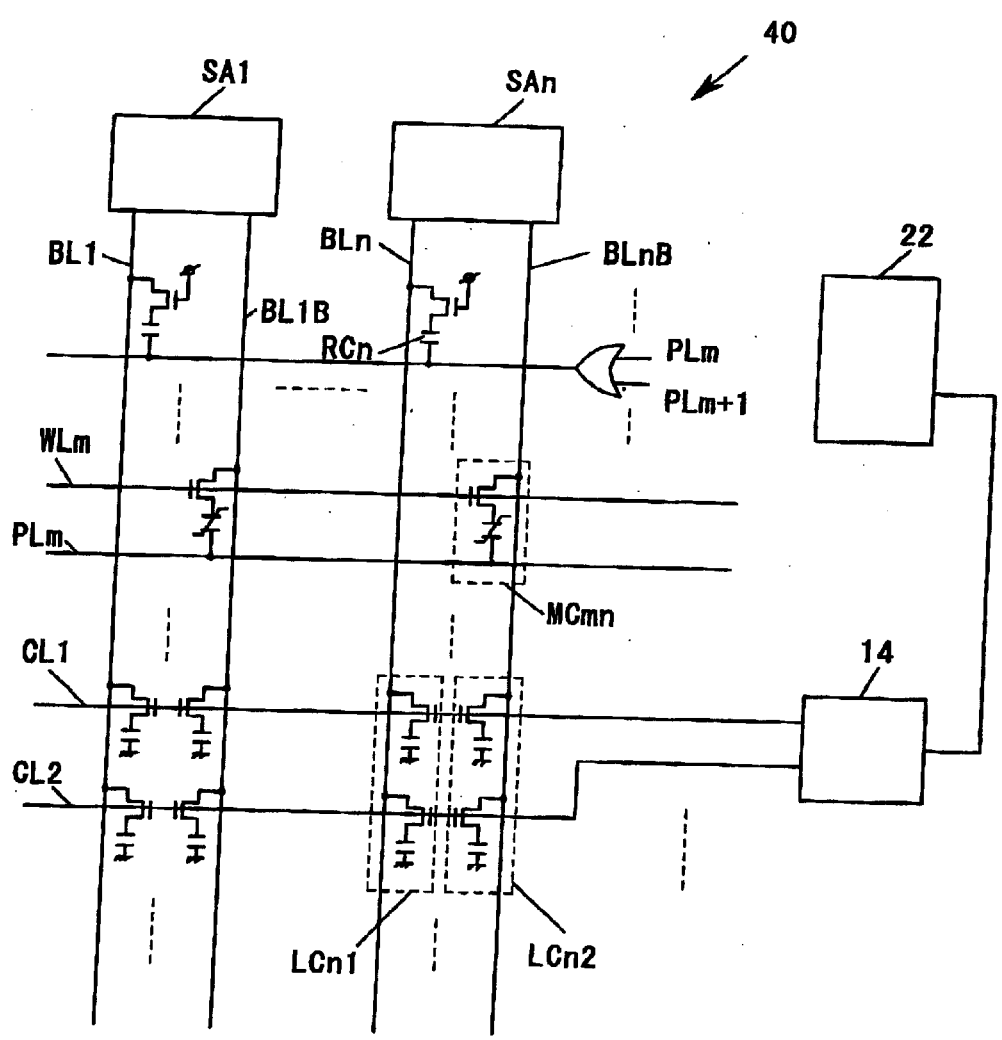
FIG. 9 shows part of the circuit constitution of a ferroelectric memory 40, a semiconductor memory device as still another embodiment of the present invention.

Next, FIG. 9 shows part of the circuit constitution of a semiconductor memory device, a ferroelectric memory 40, as still another embodiment of the present invention. The circuit constitution of the ferroelectric memory 40 is made by applying the circuit constitution of the ferroelectric memory 20 shown in FIG. 2 above to the ferroelectric memory 30 of the above-described 1T1C type. That is, the ferroelectric memory 40 of FIG. 9 is not provided with comparators CMP1, . . . , CMPn, . . . , and the low voltage detecting section 12, but instead provided with an access number detecting section 22.

Therefore, likewise with the ferroelectric memory 20 shown in FIG. 2, the embodiment shown in FIG. 9 is arranged to change the capacitance values of the loading capacitors LCn1 and LCn2 on condition that the number of accesses reaches a preset value. Therefore, it is possible to change automatically the capacitance values of the loading capacitors LCn1 and LCn2 so that data can be read accurately again with the simple constitution of counting the number of accesses.

In the above embodiment, one element capacitor is chosen from among plural element capacitors of different capacitance values and the chosen one is used to constitute the loading capacitor. However, the present invention is not limited to the above embodiment.

For example, it is possible to choose one, two or more element capacitors from plural clement capacitors and the chosen capacitors are connected in parallel to constitute a loading capacitor. In that case, it is possible to make all the capacitors with an identical capacitance value. Or, it is possible to constitute the loading capacitor by connecting the chosen element capacitors in series.

Each of the above embodiments is arranged such that the data judgment voltage is set to be within a preset allowable range and near the lower limit of the allowable range either in the initial state or after changing the capacitance value of the loading capacitor. However, the present invention is not limited to such an arrangement. For example, it is possible to arrange that, either in the initial state or after changing the capacitance of the loading capacitor, the data judgment voltage is within the preset allowable range in the approximate middle or near the upper limit of the allowable range.

While the above embodiments are arranged to determine whether or not to change the capacitance of the loading capacitor depending on whether or not the data judgment voltage exceeded a predetermined allowable range or on whether or not the number of accesses to the ferroelectric memory reached a preset value, the present invention is not limited to such an arrangement.

For example, it is possible to determine whether or not to change the capacitance of the loading capacitor depending on whether or not the operation time or the time elapsed with data held unchanged has reached a predetermined period of time.

The above embodiments are also described with examples of the ferroelectric capacitor and the reference cell (paraelectric capacitor) as the memory-purpose capacitors, it is also possible to use other capacitors as the memory-purpose capacitors. The present invention is also applicable to semiconductor memory devices using memory-purpose elements that are no capacitors.

A semiconductor memory device according to the invention for reading data stored in a memory-purpose capacitor comprising the memory-purpose capacitor for storing data and a loading-purpose capacitor connected substantially in series with the memory-purpose capacitor at least when data are read. The semiconductor memory device is for reading data on the basis of a potential produced at the connecting point of the memory-purpose capacitor and the loading-purpose capacitor as a result of a reading voltage applied across both ends of a compound capacitor constituted with the memory-purpose capacitor and the loading-purpose capacitor interconnected substantially in series. The semiconductor memory device is characterized by being arranged such that the capacitance of the loading-purpose capacitor may be changed so that data may be read without any problem.

Therefore, even if reading data stored in the memory-purpose capacitor becomes hard due to increase in the number of accesses to the semiconductor device or due to deterioration or change in the data holding characteristic of the memory-purpose capacitor associated with holding data for a prolonged period of time, it is possible to change the potential produced at the connecting point of the memory-purpose capacitor and the loading-purpose capacitor by changing the capacitance of the loading-purpose capacitor. As a result, it becomes possible again to read data. Thus, data can be read accurately over an extended period of time.

A semiconductor memory device according to the invention is characterized by the use of a ferroelectric as a dielectric for the memory-purpose capacitor.

Therefore, even if reading data stored in the ferroelectric capacitor becomes hard due to fatigue phenomenon or imprint effect of the ferroelectric capacitor associated with increasing the number of accesses to the semiconductor device or holding the data for an extended period of time, it is possible to change the potential produced at the joining point of the ferroelectric capacitor and the loading capacitor by changing the capacitance of the loading-purpose capacitor.

A semiconductor memory device according to the invention is characterized by being constituted to count at least either the number of reading actions or the number of writing actions to the memory-purpose capacitor and that the capacitance of the loading-purpose capacitor is changed on condition that the counted number reaches a preset value.

A semiconductor memory device according to the invention is characterized by being constituted to measure the data judgment voltage obtained on the basis of the potential produced at the joining point and to change the capacitance of the loading capacitor on condition that the data judgment voltage measured exceeds a preset allowable range.

Therefore, if difficulty occurs in reading data stored in the memory-purpose capacitor, the occurrence is securely detected and the capacitance of the loading capacitor can be changed, not only in case of deterioration in the data holding characteristic of the memory-purpose capacitor due to increase in the number of accesses but also in case of a change in the data holding characteristic of the memory-purpose capacitor associated with retaining the same data for an extended period of Lime.

A semiconductor memory device according to the invention is characterized in that the capacitance of the loading capacitor is changed such that the data judgment voltage is within a preset allowable range near the lower limit of the allowable range.

Holding the data judgment voltage as low as possible in this way makes it possible to hold the partial voltage applied to the memory capacitor at the time of access as low as possible. As a result, deterioration in the data holding characteristic due to accesses, etc. may be further restricted.

A semiconductor memory device according to the invention is characterized in that the capacitance of the loading capacitor is changed to a greater value.

Therefore, it is possible to further delay the deterioration in the data holding characteristic of the loading capacitor due to accesses by holding as low as possible the capacitance of the loading capacitor before being changed. In case the deterioration further goes on, it is possible to facilitate data reading by changing the potential produced at the joining point between the memory capacitor and the loading capacitor by increasing the capacitance of the loading capacitor.

A semiconductror memory device according to the invention is characterized in that plural element capacitors that can be used to constitute the loading capacitor are provided and the capacitance of the loading capacitor is changed by changing the constitution of the element capacitors used for the loading capacitor.

Therefore, it is possible for example to choose and connect in parallel an appropriate number of element capacitors out of plural element capacitors provided in advance and use them as a loading capacitor. Or it is possible to choose a single capacitor of an appropriate capacitance out of element capacitors of different capacitance values provided in advance and use it as a loading capacitor. Therefore, the capacitance of the loading capacitor may be changed easily.

A semiconductor memory device according to the invention comprising a memory-purpose element for storing data and a supplemental element associated substantially electrically with the memory-purpose element at least at the time of reading data. The semiconductor memory device is for reading data by applying a specified electric action to a compound element constituted with the memory element and the supplemental element associated substantially electrically with each other. The semiconductor memory device is characterized by being constituted with variable electric characteristic of the supplemental element so that data can be read without any problem.

Therefore, even when reading data stored in the memory-purpose capacitor becomes hard due to deterioration or change in the data holding characteristic of the memory-purpose capacitor caused by the increase in the number of accesses to the semiconductor device or due to retaining the same data in the semiconductor memory device for an extended period of time, reading data is made possible again by changing the electric characteristic of the supplemental element. That is, data may be read accurately over a long period of time.

While the present invention is described above by way of preferred embodiments, the wording is not used for limitation but used for explanation and so may be changed within the scope of appended claims without departing from the scope of the invention.

What is claimed is:

1. A semiconductor memory device comprising:

a memory capacitor for storing information; and a loading capacitor connected substantially in series with the memory capacitor at least at the time of reading data, for reading data stored in the memory capacitor according to the voltage produced at a connection point between the memory capacitor and the loading capacitor due to a reading voltage applied across both ends of a compound capacitor comprising the memory capacitor and the loading capacitor interconnected substantially in series, characterized in that the capacity of the loading capacitor is adapted to be variable based on a capacitance changing signal so that data may be read free from troubles.

2. The semiconductor memory device according to claim 1, characterized in that the memory capacitor is a ferroelectric type using a ferroelectric as a dielectric.

3. A semiconductor memory device comprising:

a memory capacitor for storing information; and a loading capacitor connected substantially in series with the memory capacitor at least at the time of reading data, for reading data stored in the memory capacitor according to the voltage produced at a connection point between the memory capacitor and the loading capacitor due to a reading voltage applied across both ends of a compound capacitor comprising the memory capacitor and the loading capacitor interconnected substantially in series, characterized in that the capacity of the loading capacitor is adapted to be variable so that data may be read free from troubles, and characterized by being constituted that at least either a number of actions of reading from or a number of actions of writing to the memory capacitor is counted and a capacitance of the loading capacitor is changed on condition that the counted number reaches a preset value.

4. The semiconductor memory device according to claim 3, characterized in that the capacitance of the loading capacitor is changed to a greater value.

5. The semiconductor memory device according to claim 3, characterized in that a sum of the number of actions of reading from and the number of actions of writing to the memory capacitor is counted and the capacitance of the loading capacitor is changed on condition that the sum of the counted numbers reaches a preset value.

6. A semiconductor memory device comprising:
a memory capacitor for storing information; and
a loading capacitor connected substantially in series with the memory capacitor at least at the time of reading data,
for reading data stored in the memory capacitor according to the voltage produced at a connection point between the memory capacitor and the loading capacitor due to a reading voltage applied across both ends of a compound capacitor comprising the memory capacitor and the loading capacitor interconnected substantially in series, characterized in that the capacity of the loading capacitor is adapted to be variable so that data may be read free from troubles, and characterized by being constituted such that a data judgment voltage obtained according to a potential produced at the connection point is measured and a capacitance of the loading capacitor is changed on condition that the data judgment voltage measured exceeds a preset allowable range.

7. The semiconductor memory device according to claim 6, characterized in that the capacitance of the loading capacitor is changed such that the data judgment voltage is within a preset allowable range near a lower limit of the allowable range.

8. The semiconductor memory device according to claim 6, characterized in that the capacitance of the loading capacitor is changed to a greater value.

9. A semiconductor memory device comprising:
a memory capacitor for storing information; and
a loading capacitor connected substantially in series with the memory capacitor at least at the time of reading data,
for reading data stored in the memory capacitor according to the voltage produced at a connection point between the memory capacitor and the loading capacitor due to a reading voltage applied across both ends of a compound capacitor comprising the memory capacitor and the loading capacitor interconnected substantially in series, characterized in that the capacity of the loading capacitor is adapted to be variable so that data may be read free from troubles, and characterized in that plural element capacitors that can be used to constitute the loading capacitor are provided and a capacitance of the loading capacitor is changed by changing the plural element capacitors that constitute the loading capacitor.

10. The semiconductor memory device according to claim 9, characterized in that plural element capacitors of different capacitance values are provided from which a single element capacitor is chosen and used to constitute the loading capacitor.

11. The semiconductor memory device according to claim 9, characterized in that one, two or more element capacitors are chosen from the plural element capacitors, and in case one element capacitor is chosen, the one element capacitor is used to constitute the loading capacitor, and in case plural element capacitors are chosen, the plural element capacitors are interconnected to constitute the loading capacitor.

12. The semiconductor memory device according to claim 11, characterized in that, in case plural element capacitors are chosen, the plural element capacitors are interconnected in parallel to constitute the loading capacitor.

13. The semiconductor memory device according to claim 12, characterized in that the plural element capacitors are of an identical capacitance value.

14. The semiconductor memory device according to claim 11, characterized in that, in case plural element capacitors are chosen, the plural element capacitors are interconnected in series to constitute the loading capacitor.

15. The semiconductor memory device according to claim 14, characterized in that the plural element capacitors are of an identical capacitance value.

16. A semiconductor memory device comprising:
a memory capacitor for storing information; and
a loading capacitor connected substantially in series with the memory capacitor at least at the time of reading data,
for reading data stored in the memory capacitor according to the voltage produced at a connection point between the memory capacitor and the loading capacitor due to a reading voltage applied across both ends of a compound capacitor comprising the memory capacitor and the loading capacitor interconnected substantially in series, characterized in that the capacity of the loading capacitor is adapted to be variable so that data may be read free from troubles, the memory capacitor is a ferroelectric type using a ferroelectric as a dielectric, and paired ferroelectric capacitors for keeping complementary polarized state are used as the memory capacitor.

17. A semiconductor memory device comprising:
a memory capacitor for storing information; and
a loading capacitor connected substantially in series with the memory capacitor at least at the time of reading data,
for reading data stored in the memory capacitor according to the voltage produced at a connection point between the memory capacitor and the loading capacitor due to a reading voltage applied across both ends of a compound capacitor comprising the memory capacitor and the loading capacitor interconnected substantially in series, characterized in that the capacity of the loading capacitor is adapted to be variable so that data may be read free from troubles, the memory capacitor is a ferroelectric type using a ferroelectric as a dielectric, and a single ferroelectric capacitor is used as the memory capacitor.

18. A semiconductor memory device comprising:
a memory capacitor for storing information; and
a loading capacitor connected substantially in series with the memory capacitor at least at the time of reading data,
for reading data stored in the memory capacitor according to the voltage produced at a connection point between the memory capacitor and the loading capacitor due to a reading voltage applied across both ends of a compound capacitor comprising the memory capacitor and the loading capacitor interconnected substantially in series, characterized in that the capacity of the loading capacitor is adapted to be variable so that data may be read free from troubles, the memory capacitor is a ferroelectric type using a ferroelectric as a dielectric, and at least either a number of actions of reading from or a number of actions of writing to the memory capacitor is counted and a capacitance of the loading capacitor is changed on condition that the counted number reaches a preset value.

19. A semiconductor memory device comprising:
a memory capacitor for storing information; and
a loading capacitor connected substantially in series with the memory capacitor at least at the time of reading data, for reading data stored in the memory capacitor according to the voltage produced at a connection point between the memory capacitor and the loading capacitor due to a reading voltage applied across both ends of a compound capacitor comprising the memory capacitor and the loading capacitor interconnected substantially in series, characterized in that the capacity of the loading capacitor is adapted to be variable so that data may be read free from troubles, the memory capacitor is a ferroelectric type using a ferroelectric as a dielectric, and a data judgment voltage obtained according to a potential produced at the connection point is measured and a capacitance of the loading capacitor is changed on condition that the data judgment voltage measured exceeds a preset allowable range.

20. A semiconductor memory device comprising:

a memory element for storing data; and a supplemental element substantially electrically associated with the memory element at least at the time of reading data, for reading data stored in the memory element by applying specified electric action to a compound element comprising the memory element and the supplemental element substantially electrically mutually associated, characterized in that an electric characteristic of the supplemental element is adapted to be variable based on a signal for changing the electric characteristic of the supplemental element so that data may be read free from troubles.

* * * * *

UNITED STATES PATENT AND TRADEMARK OFFICE
CERTIFICATE OF CORRECTION

PATENT NO.    : 6,545,901 B2
DATED         : April 8, 2003
INVENTOR(S)   : Fuchikami et al.

It is certified that error appears in the above-identified patent and that said Letters Patent is hereby corrected as shown below:

<u>Title page,</u>
Item [30], Foreign Application Priority Data, change "Sep. 14, 2001" to
-- Sep. 14, 2000 --.

Signed and Sealed this

Twenty-eighth Day of October, 2003

JAMES E. ROGAN
*Director of the United States Patent and Trademark Office*